(12) United States Patent
Caffee et al.

(10) Patent No.: US 10,778,230 B2
(45) Date of Patent: Sep. 15, 2020

(54) LOAD COMPENSATION TO REDUCE DETERMINISTIC JITTER IN CLOCK APPLICATIONS

(71) Applicant: Silicon Laboratories Inc., Austin, TX (US)

(72) Inventors: Aaron J. Caffee, Scappoose, OR (US); Brian G. Drost, Corvallis, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/661,049

(22) Filed: Oct. 23, 2019

(65) Prior Publication Data

US 2020/0162079 A1 May 21, 2020

Related U.S. Application Data

(62) Division of application No. 16/191,755, filed on Nov. 15, 2018, now Pat. No. 10,530,368.

(51) Int. Cl.
*H03K 23/66* (2006.01)
*H03K 21/02* (2006.01)

(52) U.S. Cl.
CPC ........... *H03K 21/026* (2013.01); *H03K 23/66* (2013.01); *H03K 23/667* (2013.01)

(58) Field of Classification Search
CPC ...... H03K 21/026; H03K 21/00; H03K 23/42; H03K 23/66; H03K 23/667; H03L 7/148; H03L 7/18; H03B 19/12
See application file for complete search history.

(56) References Cited

U.S. PATENT DOCUMENTS

| 8,823,459 | B2 | 9/2014 | Obkircher |
| 8,860,514 | B2 | 10/2014 | Weltin-Wu |
| 9,531,394 | B1 | 12/2016 | Caffee et al. |
| 10,067,519 | B2 * | 9/2018 | Leibowitz ............... G05F 1/462 |
| 2018/0054203 | A1 | 2/2018 | Drost | |

* cited by examiner

*Primary Examiner* — Jung Kim
(74) *Attorney, Agent, or Firm* — Zagorin Cave LLP

(57) ABSTRACT

A method for reducing deterministic jitter in a clock generator includes providing a load current through a regulated voltage node to a circuit responsive to a divide ratio. The method includes providing an auxiliary current through the regulated voltage node. The auxiliary current has a first current level during a first period corresponding to a first value of the divide ratio and the auxiliary current has a second current level during a second period corresponding to a second value of the divide ratio.

20 Claims, 6 Drawing Sheets

LOAD COMPENSATION TO REDUCE DETERMINISTIC JITTER IN CLOCK APPLICATIONS

CROSS-REFERENCE TO RELATED APPLICATIONS

This application is a divisional of U.S. patent application Ser. No. 16/191,755, filed Nov. 15, 2018, entitled "Load Compensation to Reduce Deterministic Jitter in Clock Applications," naming Aaron J. Caffee and Brian G. Drost as inventors, which application is incorporated herein by reference in its entirety.

BACKGROUND

Field of the Invention

This invention relates to generating clock signals for electronic devices.

Description of the Related Art

Referring to FIGS. 1-6, an exemplary clock path circuit includes frequency divider 104 that generates frequency divided clock signal $ck_{IN}$, which has a frequency that is the frequency of the input clock signal $ck_{IN}$ divided by a fixed divide value $n_{DIV}$. Circuit 110, which may be a driver, inverting buffer, combinational logic, an integer frequency divider, digital-to-time converter, or other circuit, receives frequency divided clock signal $ck_{DIV}$ and introduces a delay in the clock signal path. Voltage regulator 106 and voltage regulator 108 shield frequency divider 104 and circuit 110, respectively, from crosstalk and from other variations to the voltage provided by the power supply node.

Voltage regulator 106 electrically isolates frequency divider 104 from power supply noise (e.g., external supply noise from a switching mode power converter or internal supply noise from circuit 110) to reduce noise in output clock signal $ck_{OUT}$. The load current due to switching is determined by the frequency of the input clock signal $ck_{IN}$. Although voltage regulator 106 isolates frequency divider 104 from those sources of noise, voltage regulator 106 presents frequency divider 104 with a complex impedance. Low frequency variations in load current (i.e., $I_{REG}$) cause only low frequency supply variation due to the low output impedance provided by the regulator loop gain. High frequency load changes can be reduced or eliminated by using a bypass capacitance in voltage regulator 106. However, load variations at moderate frequencies can cause substantial disturbances to the power supply. The regulated voltage level variation for typical voltage regulation in a static frequency clock signal application is determined by the switching load, the load current, and the bypass capacitance of the voltage regulator. Typically, the regulated voltage level variation between a minimum regulated voltage level and a peak regulated voltage level is triangular (e.g., in low power voltage regulators with a large bypass capacitance). For example, if the fixed divider value $n_{DIV}$ equals 16, then the regulated voltage ramps from minimum voltage level $v_{MIN}$ at the beginning of a divide-by-16 interval to maximum voltage level $v_{MAX}$, at a rate of $I_{REG}/C_{REG}$, where $I_{REG}$ is the average current through regulated voltage node $v_{REG}$. Maximum voltage level $v_{MAX}$ is achieved after $16 \times P_{IN}$, which is the end of the divide-by-16 interval, where $P_{IN}$ is the period of input clock signal $ck_{IN}$ and $C_{REG}$ is a bypass capacitance of the voltage regulator.

Referring to FIGS. 4-7, in an exemplary clocking application, multi-modulus divider control circuit 202 generates multi-modulus divide value $n_{MMD}$, which is a dynamically varying divider value when divider value DIV has a fractional value. Multi-modulus divider control circuit 202 provides multi-modulus divide value $n_{MMD}$ to frequency divider 204 to cause frequency divider 204 to modulate the frequency of frequency divided clock signal $ck_{DIV}$ to have an average frequency specified by the fractional value. For example, multi-modulus divide value $n_{MMD}$ vacillates between divide value $n_{MMD}=16$ and divide value $n_{MMD}=17$, causing the average current to vary with divide value $n_{MMD}$. The ratio of the corresponding average currents is approximately 16/17 in an exemplary CMOS manufacturing technology where the overall load tends to be proportional to operating frequency. That variation in average current causes tens of millivolts of voltage variation on the power supply in an exemplary application. Frequency divider 204 and circuit 110 translate voltage errors into time errors. For example, slew rate $SR_r$ of an inverter determines delay time $t_d$ until the inverter trip point and depends on power supply voltage $v_{DD}$, the RC time constant of the inverter, temperature, and other variables:

$$SR_r = \frac{V_{DD}}{2R_{inv,p}C_L},$$

$$t_d = R_{inv,p}C_L \ln(2).$$

Use of an inverter delay is exemplary only. Delays in frequency divider 104 will vary as a function of divide value $n_{MMD}$. Thus, the variation of power supply voltage can cause substantial deterministic jitter of output clock signal $ck_{OUT}$. For example, if the delay of a clock signal path on a 1.2 V supply is 100 ps and the power supply voltage changes by 1% from a change in divide code then a change in delay of 1 ps through the signal path occurs, contributing to the jitter budget of the clock circuit.

As delay times decrease in clocking applications, conventional approaches to achieving target jitter specifications require increased bypass capacitance. Alternative approaches increase bandwidth of the voltage regulator to allow load transients to settle out before a next clock edge propagates through the signal path. Both approaches can substantially increase integrated circuit area and/or power consumption, thus increasing cost. Therefore, design techniques that reduce the circuit power consumption and area requirements while maintaining or improving clock signal generation are desired.

SUMMARY OF EMBODIMENTS OF THE INVENTION

In at least one embodiment, a method for reducing deterministic jitter in a clock generator includes providing a load current through a regulated voltage node to a circuit responsive to a divide ratio. The method includes providing an auxiliary current through the regulated voltage node. The auxiliary current has a first current level during a first period corresponding to a first value of the divide ratio and the auxiliary current has a second current level during a second period corresponding to a second value of the divide ratio.

In at least one embodiment, a clock circuit includes a voltage regulator circuit configured to provide a load current through a regulated voltage node to a circuit responsive to a divider value. The clock circuit includes an auxiliary loading circuit configured to selectively provide an auxiliary current through the regulated voltage node. The auxiliary current has a first current level during a first period corresponding to a first value of the divider value and the auxiliary current has a second current level during a second period corresponding to a second value of the divider value.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Referring to FIGS. 4-7, in at least one embodiment of clocking circuit 400, frequency divider 204, receives regulated voltage $v_{REG}$ from voltage regulator 106. Voltage regulator 106 generates regulated voltage $v_{REG}$ by providing reference voltage $v_{REF}$ and a feedback voltage from regulated node $v_{REG}$ to a transconductance amplifier and generates regulated voltage $v_{REG}$ having an average value equal to reference voltage $v_{REF}$.

Figure 1:
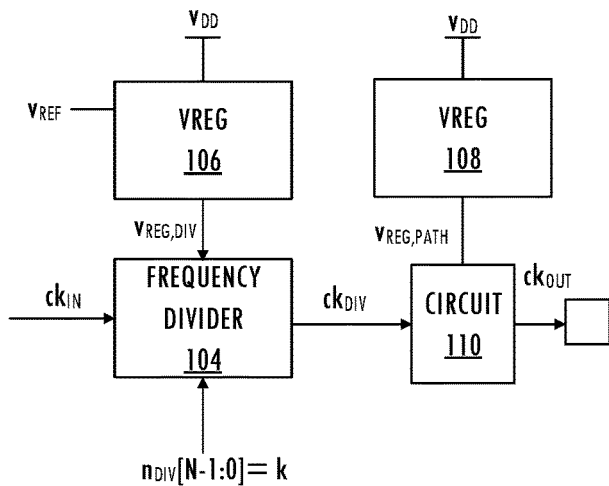
FIG. 1 illustrates a functional block diagram of a regulated static frequency divider in an exemplary clock application.
Figure 2:
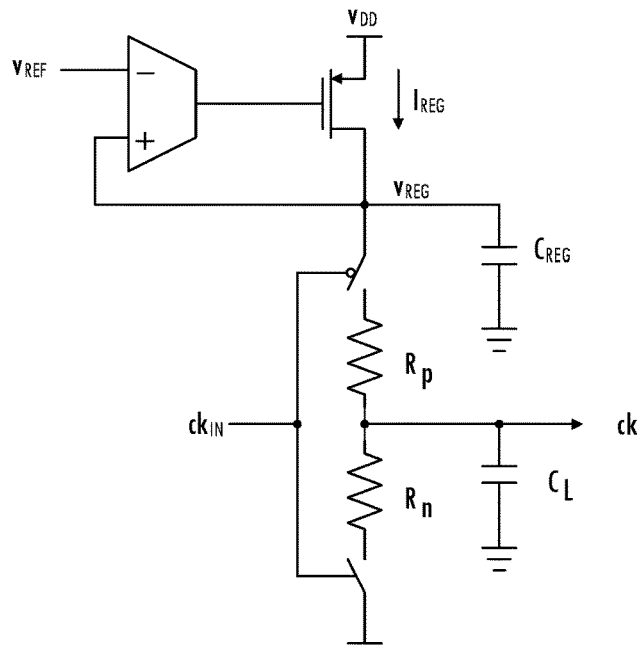
FIG. 2 illustrates a circuit model of the regulated static frequency divider of FIG. 1.
Figure 3:
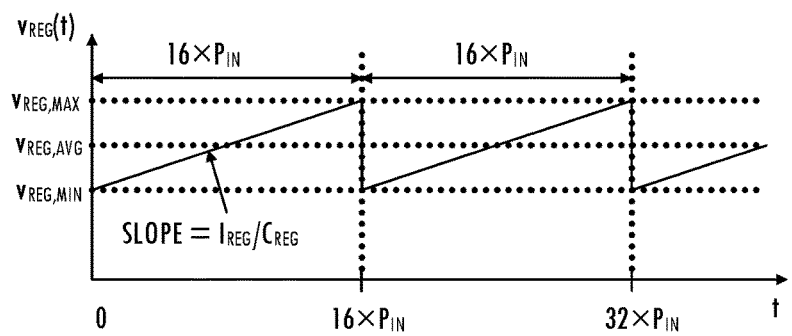
FIG. 3 illustrates a waveform of regulated voltage variation as a function of time for the static frequency divider of FIG. 1.
Figure 4:
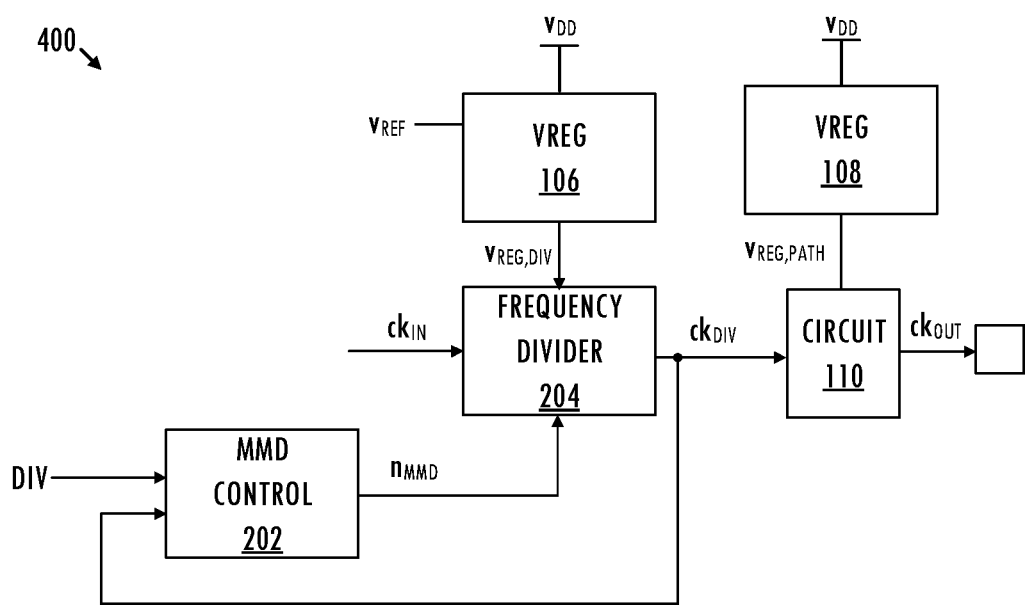
FIG. 4 illustrates a functional block diagram of a regulated multi-modulus frequency divider in an exemplary clock application.
Figure 5:
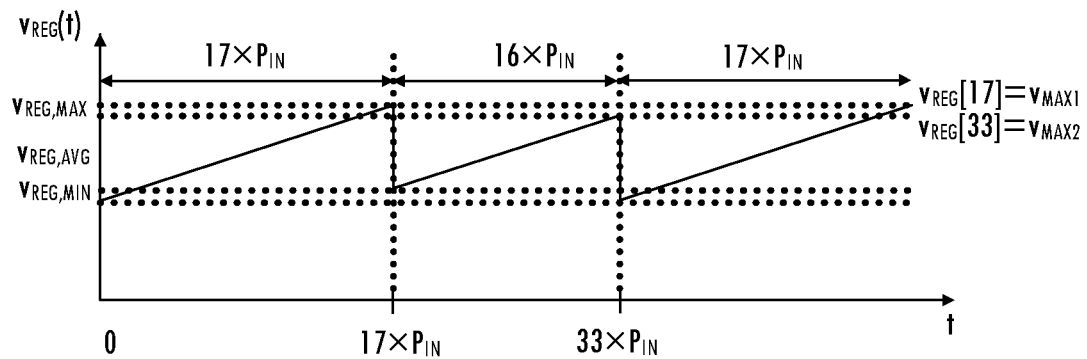
FIG. 5 illustrates a waveform of regulated voltage variation as a function of time for the multi-modulus frequency divider of FIG. 4.
Figure 6:
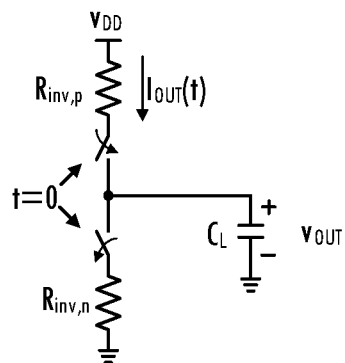
FIG. 6 illustrates a delay dependence of an inverter in the exemplary clock application.
Figure 7:
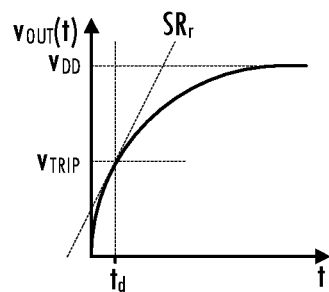
FIG. 7 illustrates output voltage as a function of time for the inverter of FIG. 6.
Figure 8:
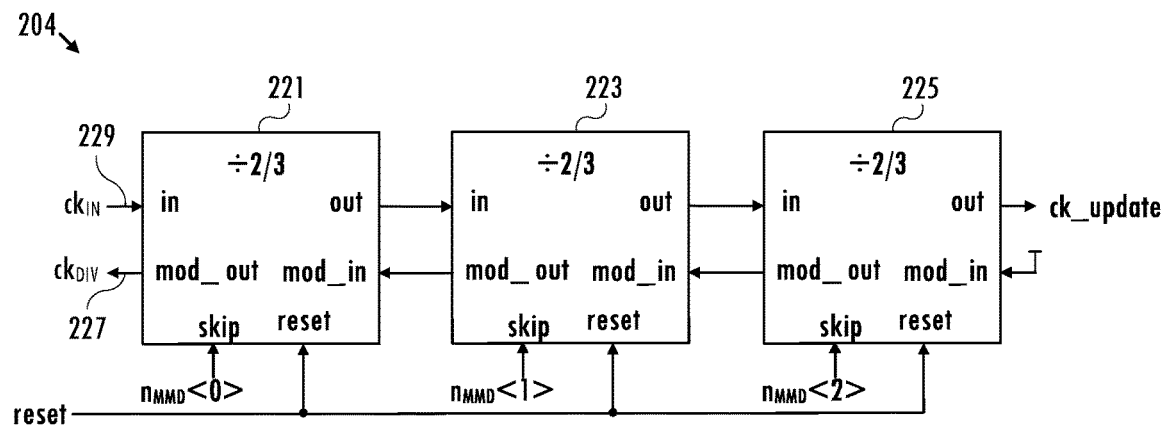
FIG. 8 illustrates an exemplary frequency divider.
Figure 9:
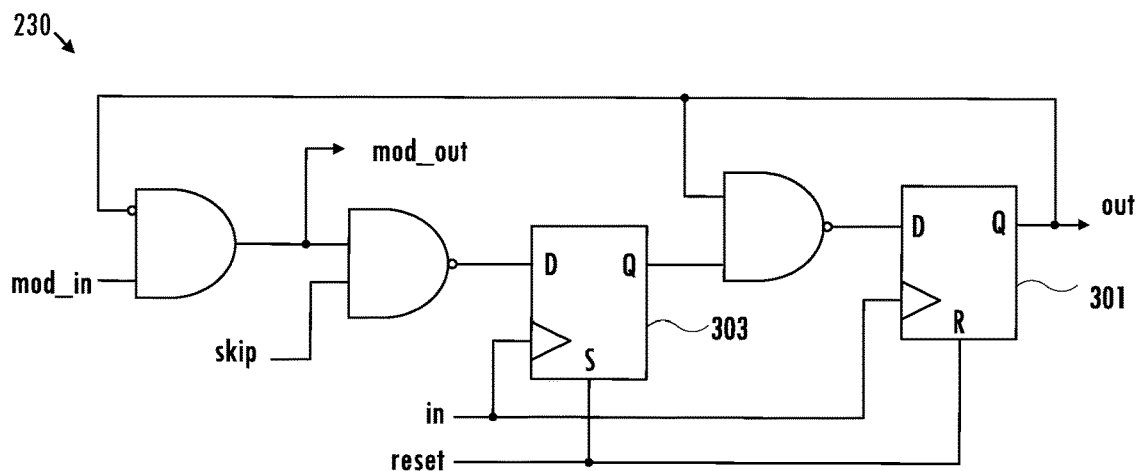
FIG. 9 illustrates an exemplary divider stage of the frequency divider of FIG. 8.
Figure 10:
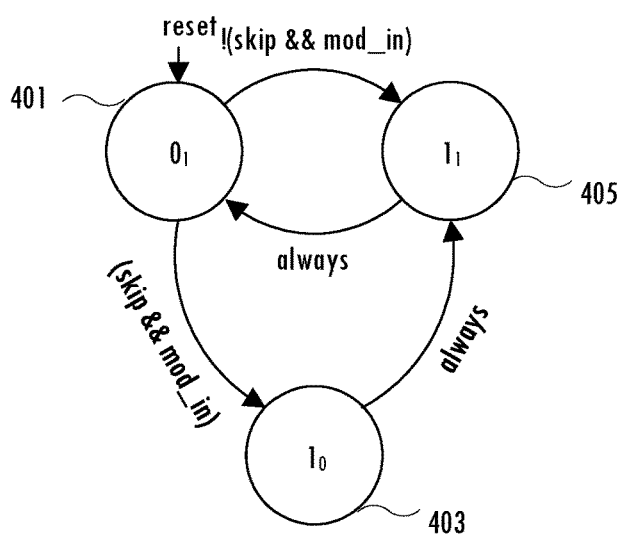
FIG. 10 illustrates a state machine associated with the divider stage of FIG. 9.

Referring to FIGS. 8-10, an exemplary frequency divider 204 includes a chain of divide ⅔ stages that can achieve high speeds with scalability. Each divider stage 221, 223, and 225 can be set to a divide by 2 or a divide by 3. In operation, once in an output period of the divider chain, a divider stage generates a modulus control signal (mod_out) and supplies the modulus control signal upstream to an adjacent divider stage as mod_in. Each divider stage includes a skip input ($n_{MMD}$<n>) that corresponds to one bit of a divide ratio. The skip input informs the divider stage whether to add one period of its input clock to the period of the output clock. In other words, the stage is configured to divide by three once during the period of the output clock. By linking the stages as shown, each stage only performs one divide-by-three operation per period of the output clock 227 ($ck_{DIV}$). That is, the first stage may be used to add one extra input clock 229 (ck_div_in) period to the period of the output clock, the second stage is used to add two extra input clock (ck_div_in) periods, and so on, when the corresponding skip input for that stage is asserted. The divide by three occurs when skip is enabled and mod_in for that particular stage is asserted. Accordingly, the three stages of frequency divider 204 of FIG. 8 can achieve divide ratios of 8-15 or $2^n$ to ($2^{n+1}-1$), where n is the number of divider stages. In terms of the divide ratio, frequency divider 204 achieves a divide ratio of $8+n_{MMD}$<2:0>.

FIG. 9 illustrates divider stage 230 that implements a divider stage of frequency divider 204. FIG. 10 illustrates a state machine associated with divider stage 230. The larger number in each state represents the output of flip-flop 301 and the smaller, subscript number in each state represents the output of flip-flop 303. As shown in the state machine of FIG. 10, the divide by three is achieved when both skip and mod_in are asserted when in state 401, causing the state machine to go to state 403 for one cycle of the input clock for that stage and then to go to state 405 for the next cycle of the input clock for that stage.

Referring to FIGS. 4-7, since frequency divider 204 is composed of CMOS logic gates, loading of frequency divider 204 on voltage regulator 106 is mostly impulsive, i.e., charge transfers from the power supply node to load capacitances is concentrated around input clock edges and output clock edges. Embodiments of voltage regulator 106 that are not fast enough to respond to such high frequency loading include a bypass capacitor that is coupled between the regulated node to ground. The bypass capacitor serves as a charge reservoir to supply the high frequency current. Voltage regulator 106 senses the effect of the loading of frequency divider 204 on regulated voltage $v_{REG}$ to adjust the average current within the bandwidth of the feedback loop. Thus, voltage regulator 106 manages regulated voltage $v_{REG}$ provided to frequency divider 204, without causing a ripple on the power supply voltage $v_{DD}$. The peak supply voltage of frequency divider 204 tends to determine the signal path delay for generation of an edge of the output clock signal. The average current changes as a function of the divide value. Accordingly, the peak supply voltage of frequency divider 204 varies according to the previously used divide value.

In an exemplary embodiment of clocking circuit 400, multi-modulus divide value $n_{MMD}$ vacillates between 16 and 17 to achieve a frequency divide by 16.5. The peak supply voltage just prior to an output clock edge transmission alternates between two different maximum values, maximum voltage level $v_{MAX1}$ at the end of a divide-by-17 interval (17×$P_{IN}$) and maximum voltage level $v_{MAX2}$ at the end of a divide-by-16 interval (16×$P_{IN}$). Therefore, an amount delay in the signal path alternates on every other output clock edge. The amount of delay modulation depends on the amount of delay in the signal path coupled to the regulated voltage, the sensitivity of that delay due to changes in power supply voltage (which tends to be proportional to the amount of the delay), and the difference in regulated voltage between maximum voltage level $v_{MAX1}$ and maximum voltage level $v_{MAX2}$. The delay modulation causes jitter and spurs in output clock signal $ck_{OUT}$.

A load compensation technique reduces deterministic jitter due to frequency-dependent supply loading in a clocking application. The load compensation technique improves spur performance and results in reduced area circuits as compared to conventional jitter-reduction techniques. An auxiliary load circuit provides a load that varies as a function of divide code. By coupling the auxiliary load to the regulated supply node, the auxiliary load selectively compensates for data-dependent load changes of the frequency divider so that the voltage regulator reduces or eliminates data-dependent load current, which reduces power supply variation and jitter. The load compensation technique reduces required bypass capacitance in the voltage regulator and associated area requirements. Thus, the auxiliary loading technique achieves higher performance systems at lower cost as compared to conventional clocking techniques.

Figure 11:
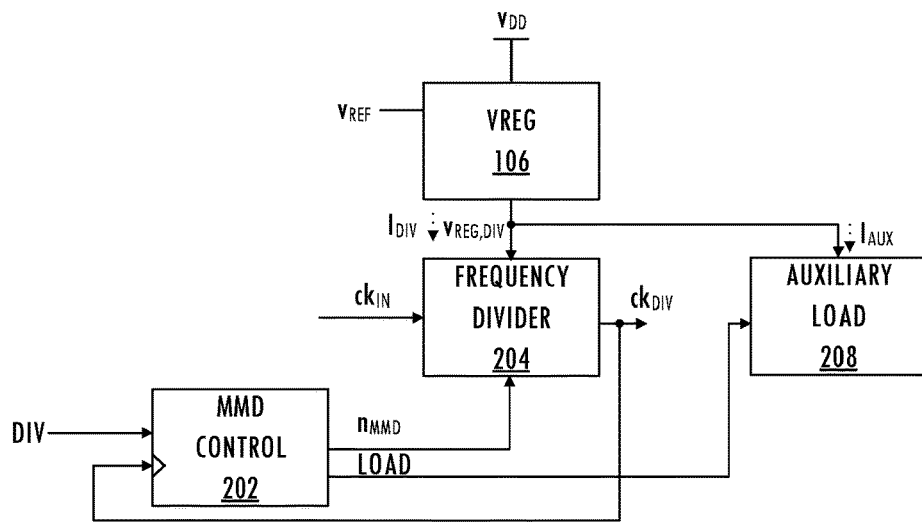
FIG. 11 illustrates a functional block diagram of a regulated frequency divider with load compensation in an exemplary clock application consistent with at least one embodiment of the invention.

Referring to FIG. 11, a load compensation technique provides load compensation to frequency divider 204, which divides a frequency of input clock signal $ck_{IN}$ by a divider value that vacillates between a first divider value (e.g., k) and a second divider value (e.g., k+1) to generate frequency divided clock signal $ck_{DIV}$ that vacillates between a first frequency and a second frequency, respectively. Multi-modulus divide control circuit 202 generates control signal LOAD, which selectively enables auxiliary load 208 to generate auxiliary load current $I_{AUX}$ (e.g., sink current from the regulated node $v_{REG}$ to ground) while multi-modulus divide value $n_{MMD}$=k+1. Auxiliary load 208 reduces or eliminates a difference between a maximum voltage level provided by voltage regulator 106 after the divide-by-k+1 interval and a maximum voltage level provided by voltage regulator 106 after a divide-by-k interval. Control signal LOAD disables auxiliary load 208 during the divide-by-k interval (i.e., does not source or sink current to or from the regulated node during a divide-by-k interval). Auxiliary load 208 reduces the range of regulated voltage $v_{REG,DIV}$ during transmission of an edge of frequency divided clock signal $ck_{DIV}$.

Figure 12:
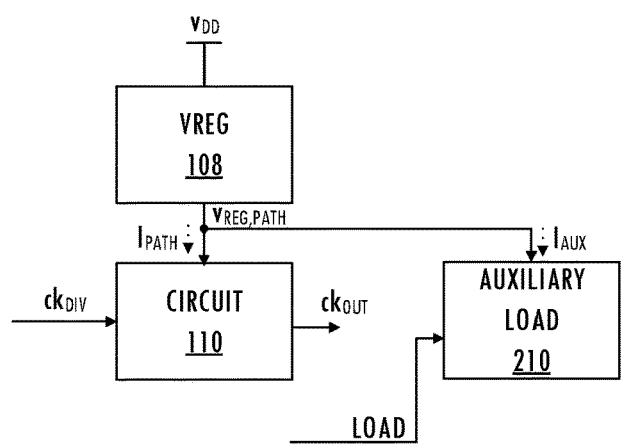
FIG. 12 illustrates a functional block diagram of a regulated circuit path with load compensation consistent with at least one embodiment of the invention.

Referring to FIG. 12, in at least one embodiment, the load compensation technique provides load compensation to circuit 110, which is a circuit path having a non-zero delay responsive to a frequency modulated clock signal (e.g., frequency divided clock signal $ck_{DIV}$). Control signal LOAD selectively enables auxiliary load 210 to generate auxiliary load current $I_{AUX}$ (e.g., sink current from the regulated node $v_{REG}$ to ground) while frequency divided clock signal $ck_{DIV}$ has a first frequency (e.g., a frequency corresponding to multi-modulus divide value $n_{MMD}$=k+1). Auxiliary load 210 compensates for a difference between a load of circuit 110 on regulator 108 due to a first frequency of frequency divided clock signal $ck_{DIV}$ and loading of circuit 110 due to a second frequency of frequency divided clock signal $ck_{DIV}$. Control signal LOAD disables auxiliary load 210 during an interval in which frequency divided clock signal $ck_{DIV}$ has the second frequency (i.e., does not source or sink current to or from the regulated node during a divide-by-k interval).

Figure 13:
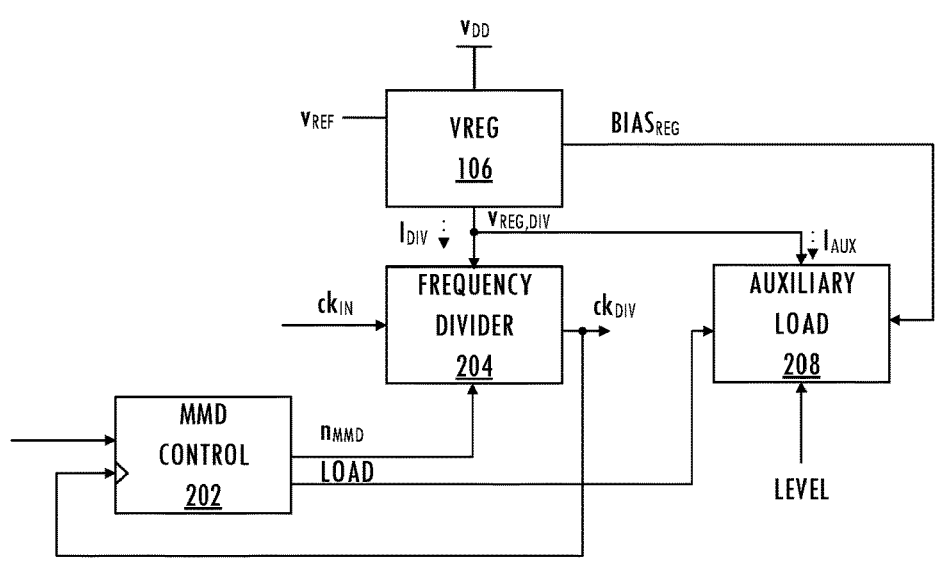
FIG. 13 illustrates a functional block diagram of a regulated frequency divider with load compensation and bias variation compensation in an exemplary clock application consistent with at least one embodiment of the invention.

Referring to FIG. 13, in at least one embodiment of the load compensation technique, voltage regulator 106 communicates bias information to auxiliary load 208. Auxiliary load 208 adjusts the load compensation according to the bias information so that the load compensation varies consistent with a variation of regulator loading due to changes in operating conditions. In at least one embodiment, auxiliary load 208 adjusts the level of auxiliary load current $I_{AUX}$ according to digital control word LEVEL to provide load compensation within the resolution of digital control word LEVEL. The value of digital control word LEVEL is determined via device characterization and stored, e.g., in non-volatile memory, or by using an auxiliary calibration loop that actively suppresses deterministic jitter. In at least one embodiment, digital control word LEVEL varies according to divider value DIV. In some embodiments, auxiliary load 208 uses a combination of bias information from voltage regulator 106 and digital control word LEVEL to adjust the load compensation applied by auxiliary load 208.

Figure 14:
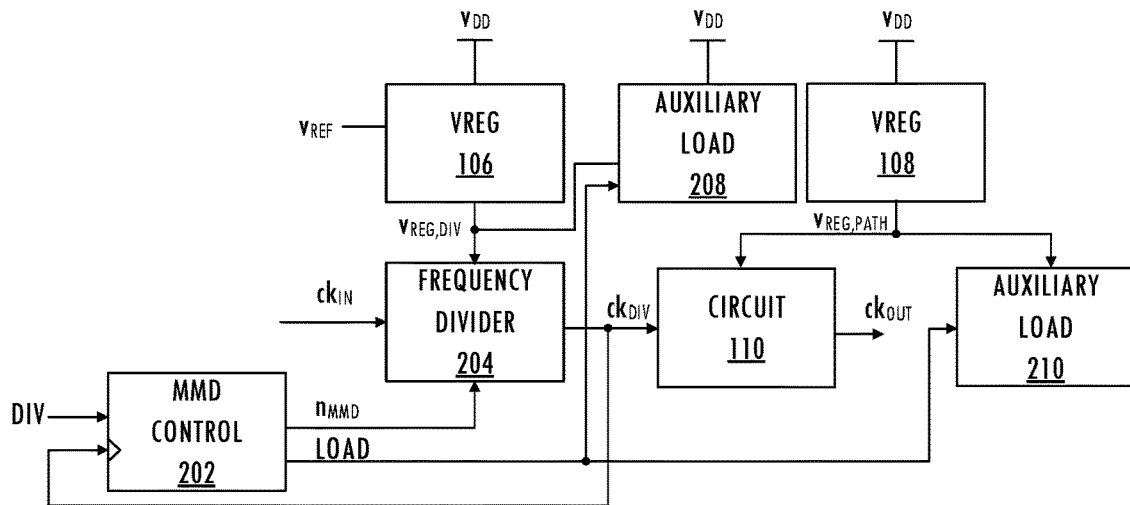
FIG. 14 illustrates a functional block diagram of a regulated frequency divider and regulated circuit path with load compensation in an exemplary clock application consistent with at least one embodiment of the invention.

Referring to FIG. 14, in at least one embodiment the load compensation technique is applied to frequency divider 204 and to circuit 110, which is responsive to the frequency modulated clock signal (e.g., frequency divided clock signal $ck_{DIV}$). Auxiliary load 208 provides load compensation for loading changes of frequency divider 204 and auxiliary load 210 provides load compensation for loading changes of circuit 110. In some embodiments, each of auxiliary load 208 and auxiliary load 210 are responsive to corresponding bias information received from a corresponding regulator and/or a corresponding digital control word LEVEL.

Figure 15:
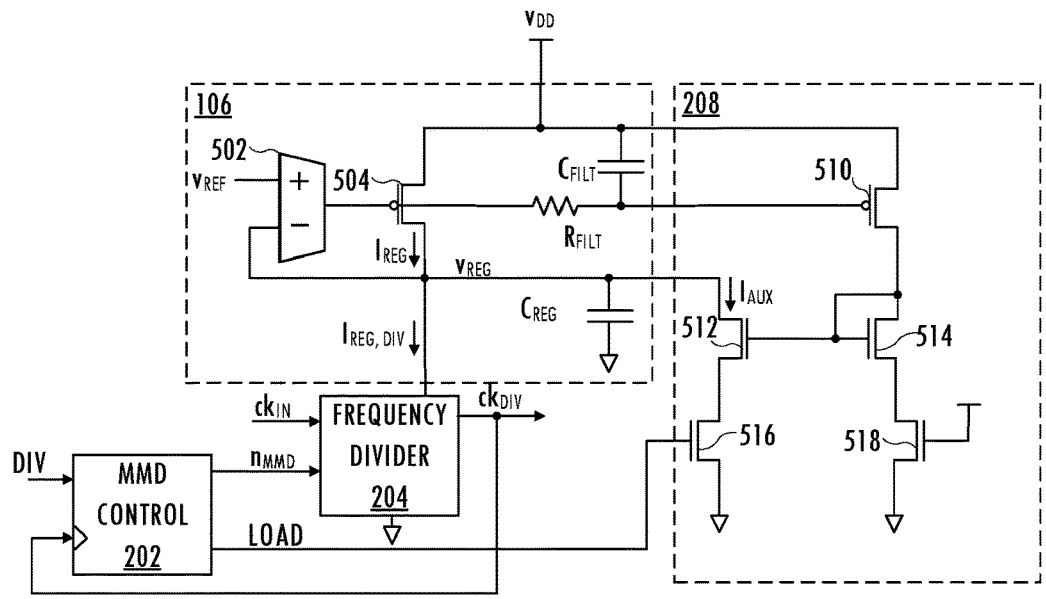
FIG. 15 illustrates a circuit diagram of an exemplary regulated frequency divider with load compensation consistent with at least one embodiment of the invention.
Figure 16:
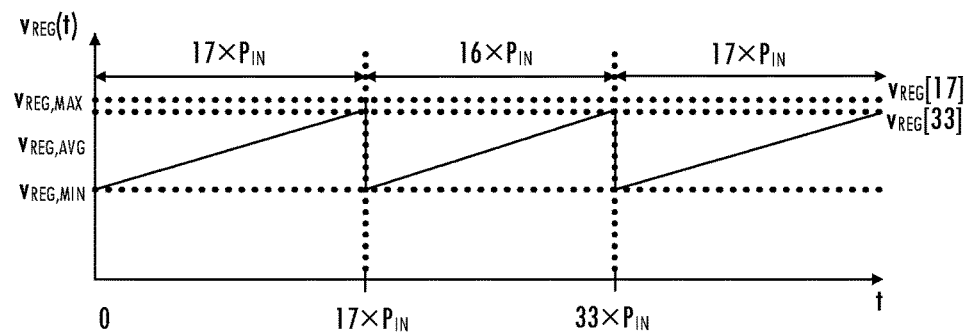
FIG. 16 illustrates exemplary waveforms of regulated voltage variation as a function of time for the frequency divider of FIG. 16.

Referring to FIGS. 11, 15, and 16, in at least one embodiment, voltage regulator 106 generates regulated voltage $v_{REG,DIV}$ by providing reference voltage $v_{REF}$ and a feedback voltage from regulated node $v_{REG}$ to transconductance amplifier 502, which drives output transistor 504 to cause the average value of the regulated voltage $v_{REG}$ to be equal to reference voltage $v_{REF}$. In at least one embodiment, auxiliary load 208 reduces or eliminates a difference between a maximum voltage level provided by voltage regulator 106 after a divide-by-17 interval and maximum voltage level provided by voltage regulator 106 after a divide-by-16 interval such that the divide-by-17 interval ramps to approximately the same maximum voltage after 17×$P_{IN}$ as divide-by-16 interval after 16×$P_{IN}$. In at least one embodiment, multi-modulus divide control circuit 202 generates control signal LOAD, which selectively enables auxiliary load 208 to generate auxiliary load current $I_{AUX}$ (e.g., sink current from the regulated node $v_{REG}$ to ground) during the divide-by-17 interval. Control signal LOAD disables auxiliary load 208 during the divide-by-16 interval (i.e., does not source or sink current to or from the regulated node during a divide-by-16 interval).

In least one embodiment, auxiliary load 208 includes transistors 510, 512, 514, 516, and 518, and sinks auxiliary load current $I_{AUX}$ from regulated voltage $v_{REG}$ to ground when enabled. For example, auxiliary load 208 applies auxiliary load current $I_{AUX}$ during the divide-by-17 time interval to cause maximum voltage $v_{MAX2}$ to be approximately the same as maximum voltage $v_{MAX1}$. To reduce or eliminate any effects of auxiliary load current $I_{AUX}$ on deterministic jitter, multi-modulus divider control circuit 202 asserts control signal LOAD to inject auxiliary load current $I_{AUX}$ immediately following the last output clock edge and then deasserts control signal LOAD to stop auxiliary load current $I_{AUX}$ well before the next output clock edge.

In at least one embodiment, each transistor in auxiliary load 208 has a size that is ratiometric with respect to transistors in voltage regulator 106 (e.g., transistor 504). Therefore, under ideal conditions, auxiliary load 208 achieves perfect cancellation of data-dependent load variations across a wide range of divider values. In at least one embodiment of auxiliary load 208, trimming of devices included in auxiliary load 208 accounts for manufacturing variations that cause those devices to vary from the ideal behavior. In at least one embodiment, transistors 510, 512, 514, 516, and 518 form a current mirror and have sizes that generate auxiliary load current $I_{AUX}$ with a magnitude that is proportional to load current $I_{REG}$. Transistor 518 serves as a replica transistor that matches the voltage drop across transistor 516 when control signal LOAD is high and transistor 516 conducts current. Control signal LOAD enables transistor 512 and transistor 516 for a number of periods of input clock signal $ck_{IN}$ to generate auxiliary load current $I_{AUX}$ with a sufficient magnitude to adjust regulated voltage $v_{REG}$ by an amount corresponding to the difference in the divide values being provided to frequency divider 204. In other embodiments, frequency divider 204 is coupled to between the regulated voltage node and a power supply node, voltage regulator 106 is coupled between the regulated voltage node and a ground power supply node, and auxiliary load 208 is coupled between the regulated voltage node and the power supply node.

The ratio between auxiliary load current $I_{AUX}$ and load current $I_{REG}$ and the interval (e.g., the number of cycles of $clk_{IN}$) for which control signal LOAD enables the auxiliary load current $I_{AUX}$ to provide sufficient current to maintain a consistent maximum regulated voltage $v_{REG,MAX}$ in response to a vacillating divider ratio may vary. Note that although the embodiments of FIGS. 11-15 use an auxiliary current that flows from a regulated voltage node to ground to maintain a maximum regulated voltage at a voltage level corresponding to a first frequency of a frequency modulated signal (e.g., multi-modulus divide value $n_{MMD}$=k when divide value $n_{DIV}$=k+1), i.e., $I_{REG}$=$I_{AUX}$+$I_{DIV}$, other embodiments may provide an auxiliary current that flows into the regulated voltage node to maintain the maximum regulated voltage at a voltage corresponding to a second frequency of the frequency modulated signal (e.g., multi-modulus $n_{MMD}$=k+1 when multi-modulus divide value $n_{MMD}$=k), i.e., $I_{REG}$ $I_{AUX}$=$I_{DIV}$. In some of those embodiments, auxiliary load 208 uses a transistor topology complementary to the transistor topology of auxiliary load 208 in FIG. 15. In at least one embodiment, the load compensation technique reduces deterministic jitter due to data-dependent supply loading in a clock application by at least a factor of ten. In other embodiments that include adaptive loops, the load compensation technique reduces deterministic jitter due to data-dependent supply loading in a clock application by more than a factor of ten.

Thus, a load compensation technique that uses an auxiliary load coupled to a regulated node to maintain a constant load on the regulated node has been described. The technique reduces deterministic jitter due to data-dependent supply loading in clocking applications. Embodiments of the load compensation technique improve performance in highly linear sub-ranging digital-to-time converters and time-to-digital converters. The resulting digital-to-time converters and time-to-digital converters support ultra-low spur performance, similar to that achieved by integer divider systems, but with the flexibility of fractional synthesis and without substantial increase in die area by reducing the required bypass capacitance.

The description of the invention set forth herein is illustrative and is not intended to limit the scope of the invention as set forth in the following claims. For example, while the invention has been described in an embodiment in which a frequency divider circuit is coupled to a regulated node and the auxiliary load, one of skill in the art will appreciate that the teachings herein can be utilized with other circuits in a signal path having selectively varied loads. Variations and modifications of the embodiments disclosed herein, may be made based on the description set forth herein, without departing from the scope of the invention as set forth in the following claims.

What is claimed is:

1. A method for reducing deterministic jitter in a clock generator, the method comprising:
   providing a load current through a regulated voltage node to a circuit responsive to a divide ratio of a divider of the clock generator; and
   providing an auxiliary current through the regulated voltage node, the auxiliary current having a first current level during a first period corresponding to a first value of the divide ratio and the auxiliary current having a second current level during a second period corresponding to a second value of the divide ratio.

2. The method, as recited in claim 1, further comprising:
   providing a frequency modulated clock signal based on the load current, the frequency modulated clock signal having a frequency vacillating between a first frequency and a second frequency,
   wherein the auxiliary current is load compensation for a load difference generated by providing the frequency modulated clock signal, the load difference being a difference between a first load corresponding to the first frequency and a second load corresponding to the second frequency.

3. The method, as recited in claim 2,
   wherein providing the frequency modulated clock signal comprises frequency dividing an input clock signal based on a regulated voltage on the regulated voltage node and a divide value vacillating between a first divide value and a second divide value,
   wherein the providing the regulated voltage includes providing a regulated current through the regulated voltage node based on a reference voltage and the regulated voltage, and
   wherein providing the auxiliary current through the regulated voltage node is based on a first control signal and a second control signal.

4. The method, as recited in claim 3,
   wherein the divider of the clock generator includes a frequency divider, and
   wherein the providing the load current and the providing the auxiliary current deliver a constant total current to the frequency divider over a variable divider period.

5. The method, as recited in claim 3, wherein the second control signal includes a pulse having a pulse width corresponding to the first frequency.

6. The method, as recited in claim 3, wherein the second control signal includes a pulse during divide periods corresponding to the first frequency.

7. The method, as recited in claim 6, wherein the pulse has a pulse width that is an integer number of input clock periods.

8. The method, as recited in claim 3, further comprising:
generating the second control signal based on a frequency divide value.

9. The method, as recited in claim 3, wherein providing the auxiliary current comprises:
mirroring and scaling the load current to generate a fractional current in response to the first control signal; and
mirroring the fractional current to generate a mirrored fractional current; and
selectively enabling the load compensation in response to the second control signal, the load compensation being based on the mirrored fractional current.

10. The method, as recited in claim 1, wherein the auxiliary current is based on a predetermined digital control word indicative of bias information.

11. The method, as recited in claim 1,
wherein a first load generates the auxiliary current having the first current level during the first period, and
wherein the first load generates no auxiliary current during the second period.

12. A clock circuit comprising:
a voltage regulator circuit configured to provide a load current through a regulated voltage node to a circuit responsive to a divider value of a divider of the clock circuit; and
an auxiliary loading circuit configured to selectively provide an auxiliary current through the regulated voltage node, the auxiliary current having a first current level during a first period corresponding to a first value of the divider value and the auxiliary current having a second current level during a second period corresponding to a second value of the divider value.

13. The clock circuit, as recited in claim 12, further comprising:
the circuit configured to use a regulated voltage on the regulated voltage node to generate a frequency modulated clock signal by frequency dividing an input clock signal according to the divider value vacillating between the first value and the second value.

14. The clock circuit, as recited in claim 12, wherein the auxiliary loading circuit is configured to selectively provide load compensation for a load difference of the circuit, the load difference being a difference between a first load corresponding to the first value and a second load corresponding to the second value.

15. The clock circuit, as recited in claim 12, wherein the auxiliary loading circuit is configured to selectively provide the auxiliary current through the regulated voltage node in response to a first control signal from the voltage regulator circuit and a second control signal.

16. The clock circuit, as recited in claim 15, wherein the second control signal includes a pulse having a pulse width corresponding to the first value.

17. The clock circuit, as recited in claim 15, wherein the second control signal includes a pulse during divide periods corresponding to the first value.

18. The clock circuit, as recited in claim 17, wherein the pulse has a pulse width that is an integer number of input clock periods.

19. The clock circuit, as recited in claim 15, wherein the circuit provides a current varying with the divider value and the auxiliary loading circuit comprises:
a first transistor configured to mirror and scale the current to generate a fractional current in response to the first control signal; and
at least a second transistor configured to mirror the fractional current to generate a mirrored fractional current; and
a load transistor configured to selectively enable load compensation in response to the second control signal, the load compensation being based on the mirrored fractional current.

20. A clock circuit comprising:
means for providing a load current through a regulated voltage node to a circuit responsive to a divide ratio of a divider of the clock circuit; and
means for providing an auxiliary current through the regulated voltage node, the auxiliary current having a first current level during a first period corresponding to a first value of the divide ratio and the auxiliary current having a second current level during a second period corresponding to a second value of the divide ratio.

* * * * *